April 18, 1967 J. S. WALKER 3,315,133

INTEGRATED CIRCUIT INTERCONNECT AND METHOD

Filed Sept. 29, 1965

2 Sheets-Sheet 1

INVENTOR
JOHN S. WALKER

BY Mueller, Aichele & Rauner

ATTORNEYS

April 18, 1967 J. S. WALKER 3,315,133

INTEGRATED CIRCUIT INTERCONNECT AND METHOD

Filed Sept. 29, 1965

2 Sheets-Sheet 2

3,315,133
INTEGRATED CIRCUIT INTERCONNECT AND METHOD

John S. Walker, Phoenix, Ariz., assignor to Motorola, Inc., Franklin Park, Ill., a corporation of Illinois
Filed Sept. 29, 1965, Ser. No. 491,342
7 Claims. (Cl. 317—101)

This application pertains generally to interconnecting circuit conductors on printed circuit boards and more particularly to the construction of printed circuit boards adapted to use opposed electrode welding for interconnecting integrated circuit modules.

Opposed electrode welding for interconnecting conductors has found general acceptance within the electronic industry because of the highly reliable joint that is formed using the combination of mechanical pressure of the opposing electrodes and a high welding current. Other welding methods have been proposed, for example, parallel gap welding of micromodules with the electrodes placed adjacent and parallel to each other. The joints so formed are not as reliable and have not been as completely proven under actual operating conditions as, for instance, has opposed electrode welding. However, in the past opposed electrode welding for some applications has proven to be extremely difficult, for instance, the welding of integrated circuit packages to printed circuit boards. The reason for this is the interspacing of the insulating board between the two welding electrodes.

Other problems have been encountered in interconnecting integrated circuit packages to printed circuit boards which in many instances have printed circuitry on both the top and bottom sides of the boards. For example, in order to connect the terminals of a package to both sides of the board, all of the terminals of the package are generally welded to one side as an intermediate step to transferring some of the terminals to the printed circuitry on the other side of the board, thereby increasing the number of welds required. Furthermore, the transferring of the circuit from the top to the bottom of the board is inconvenient and requires such methods as plating through the board or the use of hand wiring.

It is one object of this invention to provide an improved printed circuit board for interconnecting circuit components that has highly reliable welded joints formed by opposed electrode welding.

It is another object of this invention to provide an improved method for interconnecting subminiature circuit components on a printed circuit board by using opposed electrode welding.

It is another object of this invention to provide an improved circuit board for interconnecting integrated circuits that has the individual leads of the integrated circuit packages welded directly to the required layer of circuitry on either side of the printed circuit board.

It is another object of this invention to provide a printed circuit board for interconnecting integrated circuits that provides for a simple electrical connection between the printed circuitry on either side of the printed circuit board.

It is still another object of this invention to provide an improved method for making a reliable electrical connection between printed circuitry on either side of a printed circuit board.

It is a further object of this invention to provide a printed circuit board for interconnecting integrated circuits that eliminates hand wiring, expedites production and reduces costs.

A feature of this invention is the provision of a printed circuit board for interconnecting circuit components having predetermined apertures therein, and printed circuitry on either side of the insulating board having terminal portions bridging the apertures in a spaced relation thereby providing terminals to connect the circuit components to either side of the insulating board. The apertures permit connection to circuits on both sides of the board and provide access for opposed welding electrodes.

Another feature of this invention is the method of interconnecting integrated circuits on a printed circuit board including the steps of mounting the integrated circuit packages to the insulating board, extending opposed welding electrodes through the predetermined apertures in the board, selectively compressing therebetween leads extending from the integrated circuit packages and selected terminal portions of the printed circuit, and passing a welding current through the electrodes to weld each lead of the package directly to the required layer of circuitry on either side of the insulating board.

A further feature of this invention is the provision of a printed circuit board for interconnecting integrated circuits having pin connectors for interconnecting individual boards that are subassemblies of a unit of electrical equipment, and which connectors are electrically and mechanically connected to portions of the printed circuitry terminals bridging selected apertures so that the pins are alternatively connected to printed circuitry on either side of the insulating board.

Figure 1:
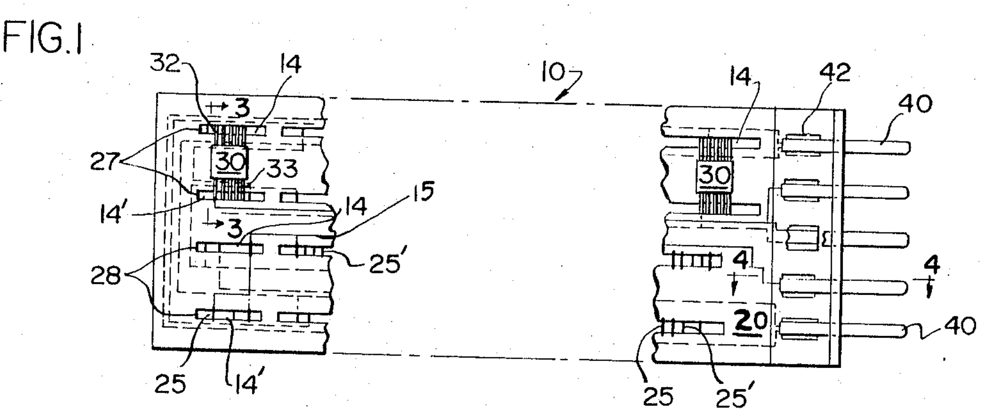
FIG. 1 is a top plan view of a printed circuit board used for interconnecting circuit conductors in accordance with this invention.
Figure 2:
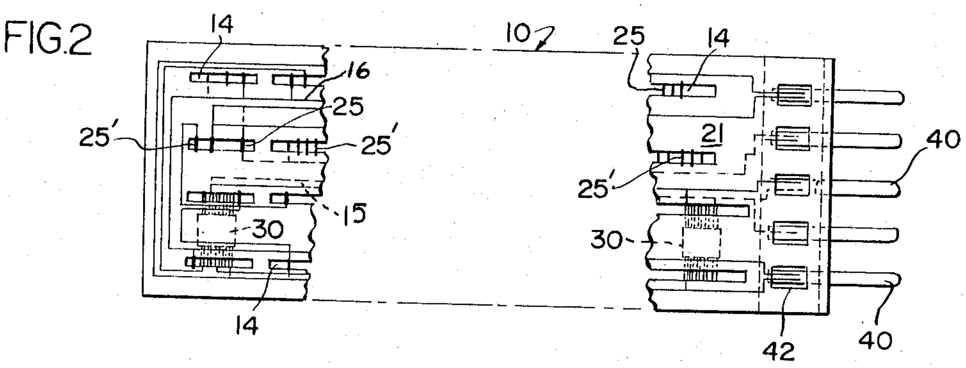
FIG. 2 is a bottom plan view of the printed circuit board of FIG. 1.

In one embodiment of the invention, a board made of insulating material has predetermined apertures punched or etched into the same. One sheet of conductive material is then bonded to each side of the insulating board. The sheets are etched in accordance with a predetermined pattern to form printed circuits. The printed circuits are so formed that portions of the circuitry on each side of the board serves as terminals and bridge the apertures in a spaced relationship. Packages containing integrated circuits are then bonded to the board. The leads extending from the packages are welded to those terminal portions of the circuitry bridging the apertures by extending opposed electrodes into the apertures, compressing the leads and the terminal portions together between the electrodes and applying a welding current through these electrodes. By selecting the terminal portions to which a particular lead is to be welded, the various leads can be connected to the printed circuitry on either side of the board, and the packages can be effectively interconnected. In addition to the terminals other portions of the circuitry may bridge selected apertures on either side of the board and be welded at these apertures by using the opposed electrode method thereby providing a simple electrical connection between the printed circuitry on one side of the board and that circuitry on the other side. The apertures can also be used to weld pin connectors to the printed circuitry on both sides of the board by the opposed electrode method. The pin connectors function to join together the printed circuitry of individual printed circuit boards that are subassemblies of a unit of electrical equipment.

The words "printed circuit" as used in this application means an insulating sheet having conductive layers thereon wherein the layers are formed by printing, plating, deposition, etching or any other process.

A better understanding of one embodiment of this invention may be had by referring to the figures of the drawing. Although the following description is for the interconnection of flat packages housing integrated circuits, it should be clear that it would pertain to any housing for integrated circuits or for the interconnecting of any circuit components on a printed circuit board.

Referring to FIGS. 1 through 3, and FIG. 6, a printed circuit board 10 is constructed, first in a step A (FIG. 6) taking an insulating board 12 made of Mylar, for instance, and then in step B etching therein elongated predetermined apertures or holes 14. Other insulating materials besides Mylar may be used, and if the material cannot be etched the apertures 14 can be punched into the board in the predetermined pattern. According to step C insulating board 12 is then coated on both sides by an uncured adhesive. Two conductive sheets 15 and 16 are obtained as in step D, which may consist of a material such as Kovar. In step E the sheets are each coated with a resist material on one side. In this particular instance, gold was used because it could be easily plated to the Kovar. Step F is then performed wherein insulating board 12 is sandwiched between the two conductive sheets 15 and 16, by placing the sheets on the top 20 and bottom 21 of the board 12 with the gold surface 18 toward the insulating board. In step G heat and pressure are applied to laminate the insulating board 12 between the conductive sheets. Subsequently, in step H the exposed Kovar surfaces on conductive sheets 15 and 16 are coated with a photo-resist and exposed to the predetermined circuit pattern. The photo-resist is then cured and the Kovar etched away in the unwanted areas. The excess gold plating in the areas where the Kovar is removed is likewise removed with a gold stripper and the printed circuit board 10 is now ready for the circuit components to be welded in place.

The gold plate on the conductive sheets covers the apertures 14 and permits etching of the sheets from both sides of the board without allowing the acid to seep through apertures 14 and attack the Kovar covering the opposite side of the aperture which cannot be protected by the resist. This results in printed circuitry being etched in a predetermined pattern on each side of the insulating board (FIG. 1), which circuitry includes terminal or bridge portions 25 that bridge the apertures 14 on the top 20 of the board 12, and terminal portions 25' which bridge the apertures 14 on the bottom 21 of the board 12. These terminal portions 25 are formed in a parallel spaced relation with the terminal portions 25' and serve as terminals for the leads of the "flat packs" which are mounted to the insulating board 12 as will be described subsequently.

The apertures 14 extend longitudinally in a parallel spaced relation along the board 12. In this instance, two conjugate pairs 27 and 28 of the apertures 14 and 14' are used in mounting the "flat pack" or integrated circuit package 30, as in step J detailed below. The pair of apertures 27, for instance, has the openings 14 and 14' equidistantly spaced and separated by an area sufficient to receive an integrated circuit package 30.

Figure 3:
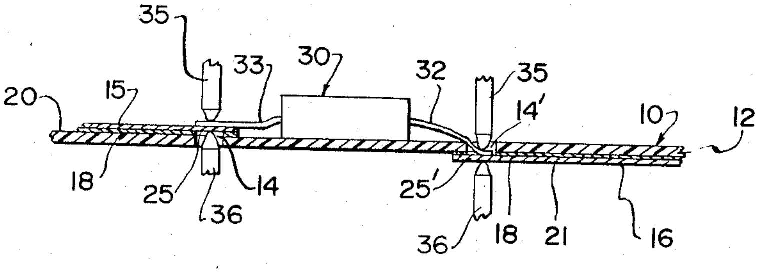
FIG. 3 is a cross-section of a portion of the printed circuit board of FIG. 1 taken along the line 3—3 showing an integrated circuit package interconnect.

In operation, this package 30 is mounted by an adhesive to the insulating board 12 in the space between the apertures 14 and 14' of the pair 27. The leads 32 and 33 extend from opposite ends of the package 30 and with the package 30 mounted in position, in the same direction as the terminal bridge portions 25 and 25'. Then in step K one of the leads 33 of the integrated circuit package 30, and one of the terminal bridge portions 25 (FIG. 3) on the top 20 of the board 12 are then mechanically compressed between opposed electrodes 35 and 36. During compression a welding current is passed through the electrodes and a highly reliable welded joint is established. Also shown in FIG. 3, is one of the leads 32 which is welded to a portion 25' on the bottom 21 of the board 12. The leads 32 and 33 may be welded in any combination to the terminals 25 and 25', and hence, to the printed circuitry on the bottom 21 and top 20 of the insulating board. In a like manner the package 30 may be mounted on the top or bottom of the board 12.

The vital role that the apertures 14 play in this invention should be clear from FIG. 3. It is the aperture 14 that permits the extension of electrode 36 through the insulating board 12 to contact the terminal portion 25 to permit the joint to be completed by opposed electrode welding. It should be equally clear when welding leads 33 to the bottom terminal portion 25', the aperture 14' permits access to the electrode 35 through the insulating board 12.

Figure 4:
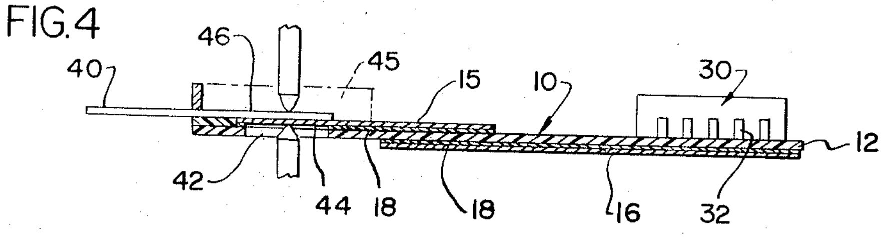
FIG. 4 is a cross-section of a portion of the printed circuit board of FIG. 1 taken along the lines 4—4 showing the pin connector interconnect.

FIG. 4 illustrates how pin connectors 40 are mounted to the printed circuit board 10. These pin connectors 40 are used to interconnect a plurality of printed circuit boards that are subassemblies of a unit of electrical equipment. Apertures 42 are etched or punched into the board 12 in the same manner as apertures 14. Terminal portions 44 of the printed circuitry 15 and 16, similar to the terminal 25, bridge the apertures 42. The pins are then welded to the printed circuitry 15 and 16 through the terminals 44 by opposed electrode welding heretofore described. After the welded connections are completed, an encapsulant 45, shown in phantom in FIG. 4, such as an epoxy, is placed over those portions 46 of the pins 40 that are connected to the terminals 44. This encapsulant 45 serves as a stress relief to inhibit the tendency of the comparatively heavy pins 40 to pull away from the relatively thin terminals 44.

Figure 5:
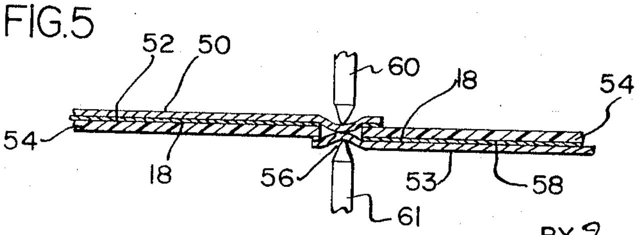
FIG. 5 is a cross-section of a portion of a printed circuit board showing the transfer of the printed circuit track from the top to the bottom of the board.
Figure 6:
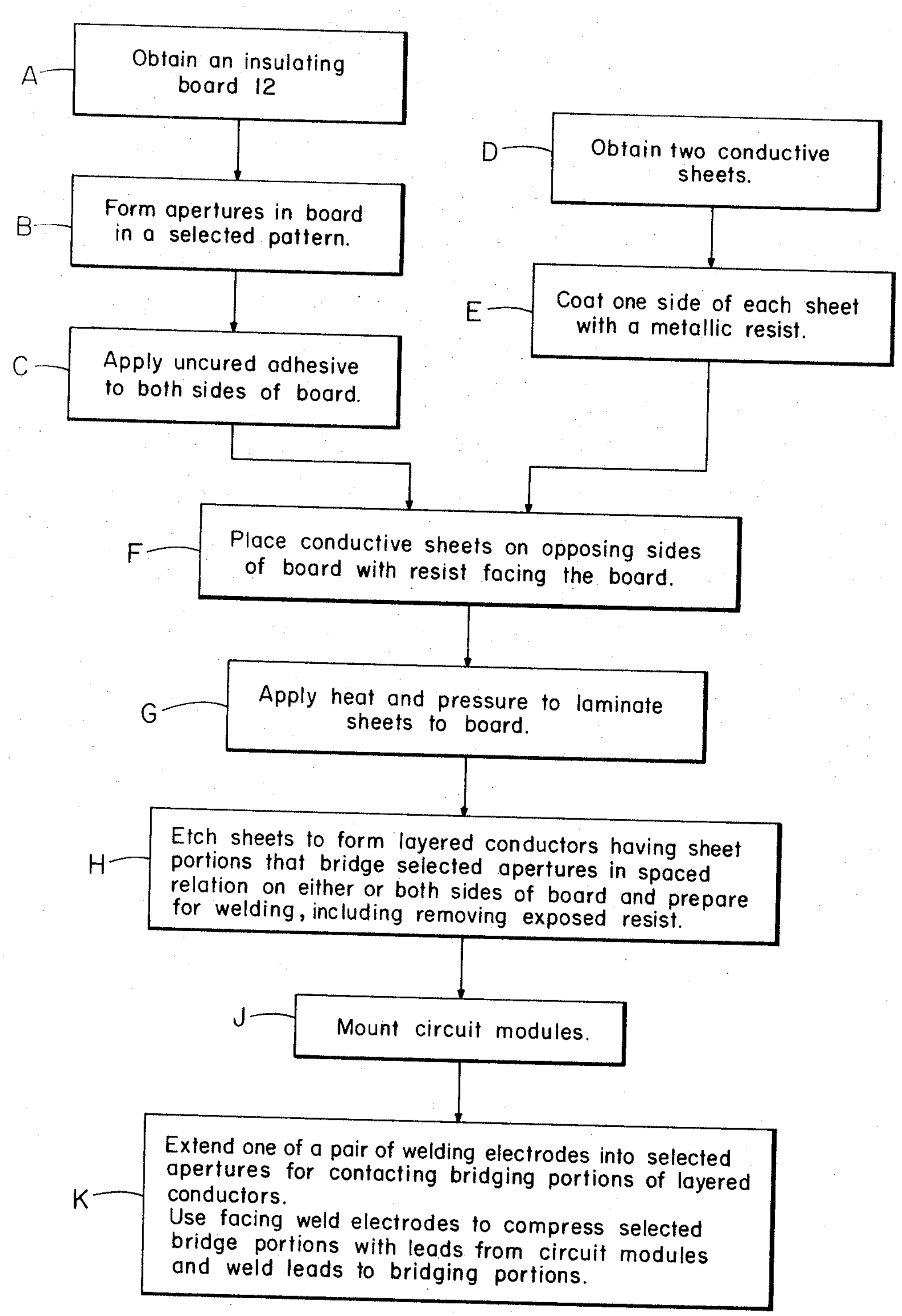
FIG. 6 is a flow chart illustrating a method of fabricating a printed circuit board which uses the teachings of this invention.

FIG. 5 shows another use for the predetermined apertures. In this instance, layers of printed circuitry 50 and 53 consisting of sheet Kovar, for example, with a layer of gold 51 plated thereto are formed in the manner previously described on the top 52 and bottom 58 of an insulating board 54. The layers 50 and 53 bridge an aperture 56 at the top and bottom respectively. The aperture 56 provides access for the electrodes 60 and 61 in the board 52, and the printed circuits are welded together at this point by opposed electrode welding as previously described. Thus, a reliable, simple means for connecting the printed circuitry on one side of the insulating board to that circuitry on the other side of the board has been devised.

What has been described, therefore, is a reliable, rapid, relatively inexpensive means for interconnecting integrated circuit packages on a printed circuit board that permits connecting of the integrated circuits directly to the printed circuitry on either side of the board and to other subassembly boards by opposed electrode welding.

I claim:

1. Apparatus for interconnecting components on a printed circuit board including in combination, insulating board means having first and second sides and a plurality of predetermined apertures extending therethrough, printed circuit means deposited on each of said first and second sides of said insulating board means and having portions thereof bridging said apertures on each of said sides, component means having a plurality of leads extending therefrom, said component means being mounted to said insulating board means and having certain of said leads thereof engaging selected portions of said circuit means bridging said apertures on said first side, with said apertures providing access to said printed circuit means on said first side of said board for electrically and mechanically joining said leads thereto, and at least one of said leads extending into one of said apertures and engaging said portion of printed circuit means on said second side of said board and being electrically and mechanically joined to said printed circuit portion bridging said one aperture on said second side thereof.

2. Apparatus for interconnecting components on a printed circuit board, including in combination, insulating board means having first and second sides and with a plurality of apertures extending therethrough, exposed printed circuit means on both of said sides and having portions bridging certain of said apertures, component means having a plurality of leads extending therefrom, said component means being mounted on said second side and having leads engaging and connected to selected portions of said circuit means bridging selected apertures on said first side with such engaging leads extending through said selected apertures, and means interconnecting said circuit means on said first side to circuit means on said second side.

3. An interconnect for integrated circuits on a printed circuit board, including in combination, an insulating board having first and second sides, predetermined elongated apertures extending in a longitudinal direction in said insulating board, said apertures formed in conjugate pairs and in spaced relation with each other, printed circuits on each of said first and second sides of said insulating board and having portions thereof bridging said apertures transversely to said board on said first side of the same in a spaced relation, housing means for housing said integrated circuits, said housing means having a plurality of leads extending from one side thereof and a plurality of leads extending from the side opposite said one side, said housing means being mounted to said insulating board on said first side between said conjugate pairs of said apertures with said leads thereof extending in generally the same spaced relation transverse to said insulating board as said portions of said printed circuitry bridging said apertures, certain ones of said leads engaging said printed circuitry on said first side of said insulating board and being electrically and mechanically joined to selected portions bridging said apertures on said first side thereof with a lead extending into an aperture interconnecting the integrated circuit on said first side to the printed circuit on said second side.

4. Apparatus for interconnecting printed circuit board subassemblies having circuit components interconnected thereon and which subassemblies when connected together form a unit of electrical equipment, including in combination, insulating board means having first and second sides and a plurality of predetermined apertures extending therethrough, printed circuit means deposited in a predetermined manner on each of said first and second sides of said insulating board means and having portions thereof bridging said apertures on at least one side of said insulating board means, means electrically interconnecting said circuit means on said first side to said circuit means on said second side, circuit component package means mounted on said insulating board means and electrically and mechanically connected to said printed circuit means on said one side thereof, and pin connecting means for interconnecting subassemblies of printed circuit boards, said pin connecting means being electrically and mechanically connected to said printed circuit portions bridging selected apertures on at least one side of said insulating board means thereby connecting said pin connecting means to said printed circuitry.

5. Apparatus for interconnecting printed circuit board subassemblies having integrated circuits interconnected thereon, which subassemblies when connected together form a unit of electrical equipment, and which utilizes opposed electrode welding, the device including in combination, insulating board means having first and second sides and a plurality of predetermined apertures extending therethrough for providing access for the opposed welding electrodes to permit welding electrodes to extend through said insulating board means, printed circuit means deposited in a predetermined manner on each of said first and second sides of said insulating board means and having portions thereof bridging said apertures on each said sides, means electrically interconnecting said first and second said circuit means and disposed in at least one of said apertures, integrated circuit package means mounted on said insulating board means and being electrically and mechanically connected to said printed circuit means on at least one side of said insulating board means, and a plurality of pin connectors for interconnecting the printed circuit board subassemblies, said pin connectors and said integrated circuits being connected to said printed circuit means on said insulating board means by being welded to selected ones of said portions of said printed circuit means bridging said apertures on said one side of said insulating board means by welding electrodes extending into said apertures and welding contact with said certain one portions.

6. Apparatus for interconnecting printed circuit board subassemblies of claim 5 wherein all of said pin connectors are connected to said printed circuit means on one side of said insulating board means by being welded to selected portions of said printed circuit means bridging said apertures on said one side of said insulating board means.

7. A method for interconnecting integrated circuits on a printed circuit board, including the steps of, etching apertures in an insulating board in a predetermined pattern, plating one side of each of two conductive sheets with a metallic resist, applying an uncured adhesive to both sides of said insulating board, placing the conductive sheets on either side of the insulating board with the metallic resist facing the board, laminating the insulating board between the conductive sheets by applying heat and pressure, etching the conductive sheets on both sides of the insulating board in accordance with a predetermined pattern to form printed circuits having portions that bridge the apertures in spaced relation on both sides of the board, removing the exposed resist material, securing integrated circuit packages to the insulating board, extending one of a pair of opposed welding electrodes through the apertures in the insulating board, selectively compressing between the opposed electrodes the integrated circuit package leads and selected bridge portions of the printed circuit, and passing a welding current through the electrodes thereby welding the leads to the printed circuit on at least one side of the insulating board.

References Cited by the Examiner

UNITED STATES PATENTS

| | | | |
|---|---|---|---|
| 3,098,951 | 7/1963 | Ayer et al. | 174—68.5 X |
| 3,242,384 | 3/1966 | Klehm | 174—68.5 X |

References Cited by the Applicant

UNITED STATES PATENTS

| | | |
|---|---|---|
| 2,452,805 | 11/1948 | Sussenbach. |
| 3,115,809 | 11/1964 | Griswold. |
| 3,184,699 | 5/1965 | Spera. |

LEWIS H. MYERS, *Primary Examiner.*

L. E. ASKIN, D. L. CLAY, *Assistant Examiners.*